United States Patent [19]
Tran

[11] Patent Number: 5,550,842
[45] Date of Patent: Aug. 27, 1996

[54] EEPROM VERIFICATION CIRCUIT WITH PMOS TRANSISTORS

[75] Inventor: Nghia Tran, San Jose, Calif.

[73] Assignee: Altera Corporation, San Jose, Calif.

[21] Appl. No.: 330,761

[22] Filed: Oct. 28, 1994

[51] Int. Cl.[6] .................................................. G11C 29/00
[52] U.S. Cl. .................. 371/21.4; 371/21.1; 365/185.22; 365/201
[58] Field of Search .................................. 371/21.4, 21.1; 365/201, 185.22

[56] References Cited

U.S. PATENT DOCUMENTS 4,937,830  6/1990  Kawashima et al. .................. 371/40.1
5,347,490  9/1994  Terada et al. ...................... 365/185.22

*Primary Examiner*—Robert W. Beausoliel, Jr.
*Assistant Examiner*—Chung My Phung
*Attorney, Agent, or Firm*—Townsend and Townsend and Crew LLP

[57] ABSTRACT

The present invention provides a verification circuit for EEPROM cells by connecting PMOS verify transistors in parallel across the EEPROM cells to be tested. This configuration occupies less space on a PLD chip than prior verification circuits and allows all EEPROM bits associated with one logic cell in the PLD to be coupled to one verify path, minimizing logic complexity.

9 Claims, 1 Drawing Sheet

EEPROM VERIFICATION CIRCUIT WITH PMOS TRANSISTORS

BACKGROUND OF THE INVENTION

The present invention relates to circuitry for verifying the contents of a group of memory cells, such as Electrically Erasable Programmable Read Only Memory (EEPROM) cells. The invention is in particular applicable to programmable logic devices that are configured through the use of EEPROM cells.

A programmable logic device (PLD) is a programmable integrated circuit that allows the user of the circuit, using software control, to customize the logic functions the circuit will perform. The logic functions previously performed by small, medium and large scale integration integrated circuits can instead be performed by programmable logic devices. When a typical programmable logic device is supplied by an integrated circuit manufacturer, it is not yet capable of performing any specific function. The user, in conjunction with software supplied by the programmable logic device manufacturer, can program the PLD to perform the specific function or functions required by the user's application. The PLD then can function in a larger system designed by the user, just as though dedicated logic chips were employed.

A typical PLD consists of an array of logic cells that can be individually programmed and arbitrarily interconnected to each other to provide internal input and output signals, thus permitting the performance of highly complex combinational and sequential logic functions. The program is implemented in the PLD by setting the states of programmable elements, such as EEPROM cells, associated with each logic cell. After programming the EEPROM cells, it is useful to have the ability to verify the contents of the memory cells to ensure that the logic cell will be configured as desired.

It is known in the prior art to verify the contents of the EEPROM cells with a verification circuit including a number of NMOS transistors connected in series. Each NMOS transistor acts as a pass transistor for its associated EEPROM cell, allowing the user to test each EEPROM cell individually to determine whether or not it has been programmed as desired. However, when a number of NMOS transistors are connected in series, the device size of each transistor must increase as the number of transistors in the verify path increases. Thus, the verification circuitry occupies more and more space on the PLD chip as the number of EEPROM cells, and NMOS verification transistors, increases.

Additionally, because the device size of each NMOS transistor grows nearly linearly with each additional transistor connected in series, it is preferable to divide all the EEPROM bits associated with one logic cell in a PLD into a number of groups, creating a separate verification path for each group of EEPROM bits. While this helps control the device size of each verify transistor by minimizing the number connected in series, it adds to the complexity of the logic in the PLD by adding multiple verification paths for the EEPROM bits associated with a logic cell. Accordingly, it would be preferable to design a verification path for EEPROM cells that occupies less space on the chip die and that does not increase the complexity of logic in the PLD.

SUMMARY OF THE INVENTION

The present invention provides a verification circuit for EEPROM cells that occupies less space on a PLD chip and allows all EEPROM bits associated with one logic cell in the PLD to be coupled to one verify path. Instead of connecting all the NMOS verify transistors in series, the present invention provides for PMOS verify transistors to be connected in parallel across the EEPROM cells to be tested.

The connection of the verify transistors in parallel eliminates the need to increase the device size of each transistor as the number of transistors in the verify path increases. Instead, each verify transistor can be of an identical, and relatively small, size. Because each verify transistor is of the same size, there is no need to separate all EEPROM cells associated with one logic cell in a PLD into groups. Thus, only one verify path may be used for all associated EEPROM cells, simplifying the PLD logic.

The use of PMOS transistors in place of NMOS transistors in the verify path also improves the integrity of the signal output by the verify circuitry. The output line can be driven by a full supply voltage signal with a PMOS transistor. If an NMOS transistor were used, the output voltage would reflect a drop equal to the threshold voltage across the NMOS transistor. The stronger signal improves the signal-to-noise ratio and yields improved results when verifying the EEPROM cells.

A further understanding of the nature and advantages of the inventions herein may be realized by reference to the remaining portions of the specification and the attached drawings.

DESCRIPTION OF THE PREFERRED EMBODIMENT

Figure 1:
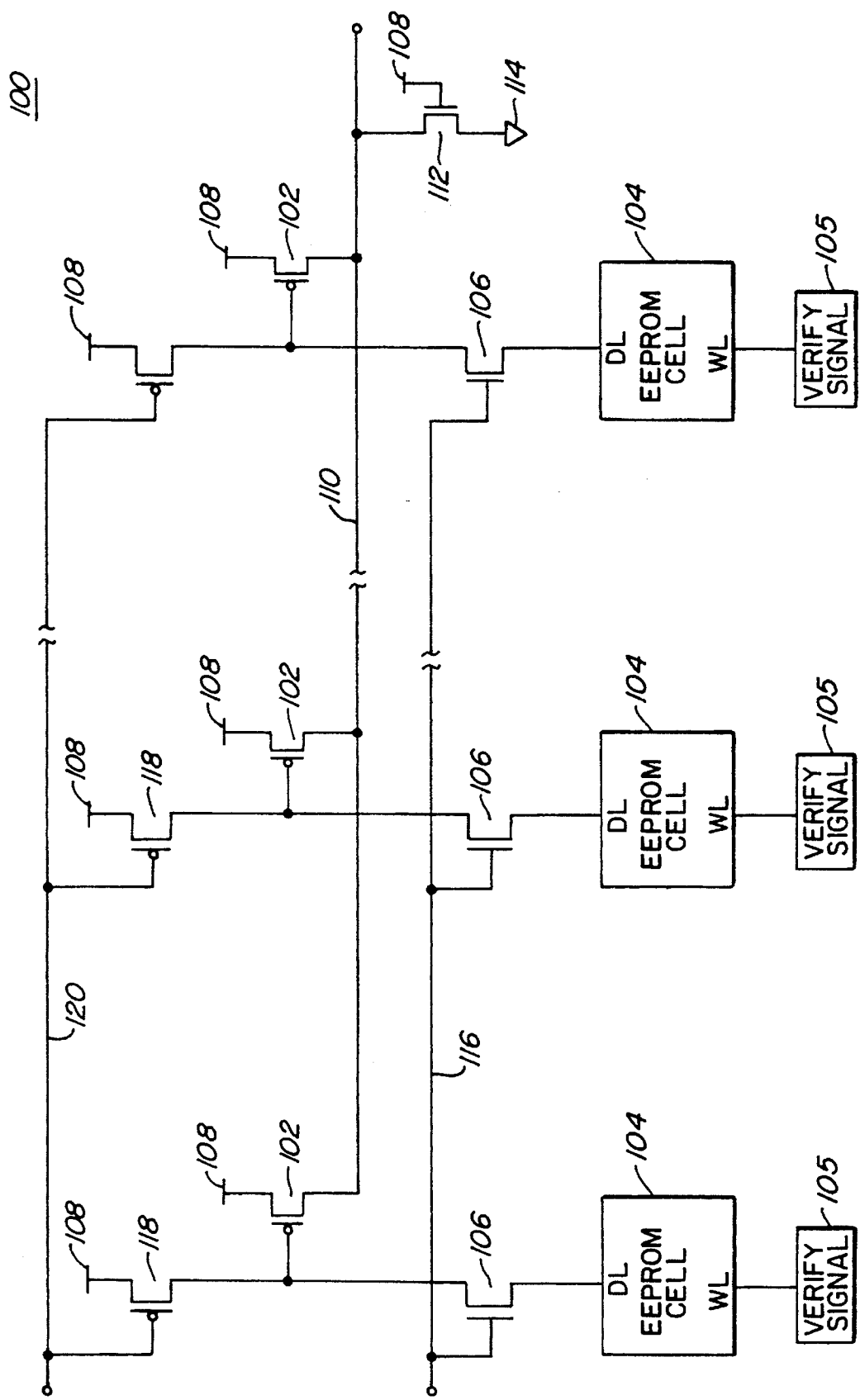
FIG. 1 is a schematic diagram of a circuit according to the present invention for verifying the contents of a group of EEPROM cells.

FIG. 1 shows a schematic diagram of a circuit according to the present invention for verifying the contents of EEPROM cells. Verification circuit 100 uses PMOS pass transistors 102 coupled in parallel to verify the contents of EEPROM cells 104 on a PLD. EEPROM cells 104 are used in programming the logic cells in the PLD to perform a user-defined logic function. The word line WL of each EEPROM cell is coupled to a means for generating a verify signal 105. The data line DL of each EEPROM cell 104 is coupled to the gate of an associated PMOS transistor 102 through an NMOS control transistor 106. The source of the each PMOS transistor 102 is coupled to a power supply potential 108. The PMOS transistors 102 are coupled in parallel, so that the drains of all transistors are coupled together to form verification output line 110. The circuit also includes a weak NMOS pulldown transistor 112. The source of NMOS pulldown transistor 112 is coupled to a ground potential 114, the gate is coupled to power supply potential 108, and the drain is coupled to verification output line 110.

Two control transistors are associated with each PMOS verify transistor 102. An NMOS control transistor 106 is coupled at its source to data line DL of EEPROM cell 104, at its drain to the gate of associated PMOS verify transistor 102 and at its gate to control line 116. A weak PMOS control transistor 118 is coupled at its source to power supply potential 108, at its drain to the gate of associated PMOS verify transistor 102 and at its gate to control line 120.

If verification circuit 100 is not in use, control transistors 106 and 118 are used to decouple the verify transistors 102 from the EEPROM cells 104. A LOW voltage signal is applied to control line 116, which turns the NMOS control transistors 106 OFF, breaking the connection between each EEPROM cell data line DL and the gate of its associated PMOS verify transistor 102. In order to ensure that the verify transistors remain OFF, a LOW signal is also applied to control line 120, which turns the weak PMOS control transistor 118 ON, pulling the gate of each PMOS verify transistor 102 up to the supply voltage 108, which turns each PMOS verify transistor 102 OFF.

If verification circuit 100 is to be used for verifying the contents of an EEPROM cell in the device, a logic HIGH signal is applied to control line 116, turning NMOS control transistors ON, establishing the connection between each EEPROM cell data line DL and the gate of its associated PMOS verify transistor 102. A logic LOW signal is still applied to control line 120, turning the weak PMOS pullup transistor 118 ON. To verify the contents of a selected EEPROM cell 104, its verify signal generator 105 generates a logic HIGH signal to be applied to the word line WL of that particular cell 104. The verify signal generators of the remaining memory cells apply a logic LOW signal to the word lines of the remaining cells. A logic LOW signal at the remaining word lines WL of EEPROM cells 104 causes the associated data lines DL to go HIGH, which turns associated PMOS verify transistors 102 OFF. This ensures that the output signal on verification output line 110 solely reflects the state of the selected EEPROM cell 104.

If the selected EEPROM cell 104 is programmed, the output at its data line DL will be LOW. This LOW signal is coupled to the gate of the associated PMOS verify transistor 102 across NMOS control transistor 106. PMOS pullup transistor 118 is weak enough so that the logic LOW signal on the data line will control the input to verify transistor 102. The LOW signal from the data line DL of the memory cell turns the associated verify transistor 202 ON, thereby coupling verification output line 110 to power supply potential 108. The HIGH signal on verification output line 110 indicates that the selected memory cell 104 is in a programmed state.

If the selected cell 104 has been erased, the output at its data line DL will be floating at an intermediate voltage level. Therefore, PMOS control transistor 118 pulls the input line to the gate of verify transistor 102 HIGH, since there is no contention with the DL output. Thus, associated PMOS transistor 102 will remain OFF, which could leave the shared drain line floating at an intermediate voltage level. Accordingly, weak NMOS pulldown transistor 112 pulls verification output line 110 to a LOW level, indicating that the selected memory cell 104 is in an erased state. NMOS pulldown transistor 112 is weak enough in comparison to the PMOS verify transistors 102 so that the selected PMOS verify transistor controls the output line 110 if both devices are active simultaneously.

The above verification circuit for EEPROM cells that connects PMOS verify transistors in parallel occupies less space on a PLD chip than the configuration of NMOS verify transistors and allows all EEPROM bits associated with one logic cell in the PLD to be coupled to only one verification path. The connection of the PMOS verify transistors in parallel eliminates the need to increase the device size of each transistor as the number of transistors in the verify path increases. Instead, each verify transistor can be of an identical, and relatively small, size. Because each verify transistor is of the same size, there is no need to separate all EEPROM cells associated with one logic cell in a PLD into groups. Thus, only one verify path may potentially be used for all associated EEPROM cells in the PLD, simplifying the PLD control logic.

The use of PMOS transistors in place of NMOS transistors in the verify path also improves the integrity of the signal output by the verify circuitry. The output line can be driven by a full supply voltage signal with a PMOS transistor. If an NMOS transistor were used, the output voltage would reflect a drop equal to the threshold voltage across the NMOS transistor. The stronger signal improves the signal-to-noise ratio and yields improved results when verifying the EEPROM cells.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A circuit for verifying the contents of non-volatile memory cells comprising:

a plurality of Electrically Erasable Programmable Read Only Memory (EEPROM) cells, each having a word line and data line;

a plurality of PMOS verify transistors associated with said plurality of EEPROM cells, each having a source coupled to a supply potential, a drain coupled to other drains of the remaining ones of said plurality of PMOS verify transistors and a gate;

a pulldown transistor having a gate coupled to said supply potential, a source coupled to a ground potential and a drain coupled to said drains of said plurality of PMOS verify transistors;

a plurality of NMOS control transistors, each having a source coupled to said data line of one of said plurality of EEPROM cells, a drain coupled to said gate of one of said plurality of said PMOS verify transistors and a gate coupled to a first control line; and a plurality of PMOS control transistors, each having a source coupled to said supply potential, a drain coupled to said gate of one of said plurality of said PMOS verify transistors and a gate coupled to a second control line.

2. The circuit of claim 1 further comprising:

means for applying said supply potential to said word line of a selected one of said plurality of EEPROM cells; and means for applying said ground potential to said word lines of the remaining ones of said plurality of EEPROM cells;

wherein said supply potential is coupled to said drains of said plurality of PMOS verify transistors through said associated PMOS verify transistor if said selected one of said plurality of EEPROM cells is in a programmed state.

3. The circuit of claim 1 further comprising:

means for applying said supply potential to said word line of a selected one of said plurality of EEPROM cells; and means for applying said ground potential to said word lines of the remaining ones of said plurality of EEPROM cells;

wherein said ground potential is coupled to said drains of said plurality of PMOS verify transistors through said pulldown transistor if said selected one of said plurality of EEPROM cells is in an erased state.

4. In a programmable logic device having inputs, outputs and programmable logic cells for performing logic functions on signals supplied to the inputs and supplying resulting output signals on the outputs, wherein said programmable logic cells are programmed by a plurality of memory cells, a circuit for verifying contents of the plurality of memory cells comprising:

a plurality of Electrically Erasable Programmable Read Only Memory (EEPROM) cells, each having a word line and data line;

a plurality of PMOS verify transistors, each having a source coupled to a supply potential, a drain coupled in parallel to other drains of the remaining ones of said plurality of PMOS verify transistors and a gate;

a pulldown transistor having a gate coupled to said supply potential, a source coupled to a ground potential and a drain coupled to said drains of said plurality of PMOS verify transistors;

a plurality of NMOS control transistors, each having a source coupled to said data line of one of said plurality of EEPROM cells, a drain coupled to said gate of one of said plurality of said PMOS verify transistors and a gate coupled to a first control line; and a plurality of PMOS control transistors, each having a source coupled to said supply potential, a drain coupled to said gate of one of said plurality of said PMOS verify transistors and a gate coupled to a second control line.

5. The circuit of claim 4 further comprising:

means for applying said supply potential to said word line of a selected one of said plurality of EEPROM cells; and means for applying said ground potential to said word lines of the remaining ones of said plurality of EEPROM cells;

wherein said supply potential is coupled to said drains of said plurality of PMOS verify transistors through said associated PMOS verify transistor if said selected one of said plurality of EEPROM cells is in a programmed state.

6. The circuit of claim 4 further comprising:

means for applying said supply potential to said word line of a selected one of said plurality of EEPROM cells; and means for applying said ground potential to said word lines of the remaining ones of said plurality of EEPROM cells;

wherein said ground potential is coupled to said drains of said plurality of PMOS verify transistors through said pulldown transistor if said EEPROM cell is in an erased state.

7. A method for verifying the contents of non-volatile memory cells comprising the steps of:

providing a plurality of Electrically Erasable Programmable Read Only Memory (EEPROM) cells, each having a word line and data line;

providing a plurality of PMOS verify transistors, each having a source coupled to a supply potential, a drain coupled in parallel to other drains of the remaining ones of said plurality of PMOS verify transistors and a gate;

providing a pulldown transistor having a gate coupled to said supply potential, a source coupled to a ground potential and a drain coupled to said drains of said plurality of PMOS verify transistors;

providing a plurality of NMOS control transistors, each having a source coupled to said data line of one of said plurality of EEPROM cells, a drain coupled to said gate of one of said plurality of said PMOS verify transistors and a gate coupled to a first control line; and providing a plurality of PMOS control transistors, each having a source coupled to said supply potential, a drain coupled to said gate of one of said plurality of said PMOS verify transistors and a gate coupled to a second control line.

8. The method of claim 7 further comprising the steps of:

applying said supply potential to said word line of a selected one of said plurality of EEPROM cells; and applying said ground potential to said word lines of the remaining ones of said plurality of EEPROM cells;

wherein said supply potential is coupled to said drains of said plurality of PMOS verify transistors through said associated PMOS verify transistor if said selected one of said plurality of EEPROM cells is in a programmed state.

9. The method of claim 7 further comprising the steps of:

applying said supply potential to said word line of a selected one of said plurality of EEPROM cells; and applying said ground potential to said word lines of the remaining ones of said plurality of EEPROM cells;

wherein said ground potential is coupled to said drains of said plurality of PMOS verify transistors through said pulldown transistor if said EEPROM cell is in an erased state.

* * * * *